(12) United States Patent
Hamano

(10) Patent No.: US 8,067,083 B2
(45) Date of Patent: Nov. 29, 2011

(54) SURFACE ORNAMENTAL STRUCTURE OF AN ARTICLE AND A METHOD FOR ORNAMENTALLY WORKING THE SURFACE STRUCTURE OF THE ARTICLE

(75) Inventor: Kimio Hamano, Sabae (JP)

(73) Assignee: Hamano Plating Co., Ltd., Sabae-shi (JP)

( * ) Notice: Subject to any disclaimer, the term of this patent is extended or adjusted under 35 U.S.C. 154(b) by 0 days.

(21) Appl. No.: 12/681,334

(22) PCT Filed: Apr. 8, 2009

(86) PCT No.: PCT/JP2009/057196
§ 371 (c)(1),
(2), (4) Date: Apr. 1, 2010

(87) PCT Pub. No.: WO2009/133757
PCT Pub. Date: Nov. 5, 2009

(65) Prior Publication Data
US 2010/0209731 A1    Aug. 19, 2010

(30) Foreign Application Priority Data

May 1, 2008    (JP) .............................. 2008-002830 U

(51) Int. Cl.
*B32B 15/00* (2006.01)
*B32B 37/00* (2006.01)
(52) U.S. Cl. ..................... 428/195.1; 428/199; 428/209; 428/542.2; 156/233; 156/238; 156/272.8; 156/541; 283/83; 283/86; 283/91

(58) Field of Classification Search .............. 283/80–86, 283/91; 156/233, 272.8, 238, 541; 428/195.1, 428/199, 209, 542.2
See application file for complete search history.

(56) References Cited

U.S. PATENT DOCUMENTS

| 5,411,296 A * | 5/1995 | Mallik ............................ 283/86 |
| 5,703,703 A * | 12/1997 | Yamate ............................ 359/1 |
| 7,037,398 B2 * | 5/2006 | Kwasny et al. ............... 156/230 |

FOREIGN PATENT DOCUMENTS

| JP | 1-241500 | 9/1989 |
| JP | 7-237400 | 9/1995 |
| JP | 2002-187398 | 7/2002 |

* cited by examiner

*Primary Examiner* — Cathy Lam
(74) *Attorney, Agent, or Firm* — Rankin, Hill & Clark LLP

(57) ABSTRACT

An article surface ornamental structure that is easy to work and able to form a decorative pattern of an optional design and a high-grade feeling produced thanks to the metallic luster and, if necessary, to form a third dimensional decorative pattern. A metal-coated layer is formed by depositing a metal material with metallic luster on a surface of a base material. The metal-coated layer is at least partly provided with a separation part, in which the based material has its surface exposed to create an ornamental pattern thanks to a difference between the outer appearance of the base material and the metallic luster of the remaining metal-coated layer. With the base material and the metal-coated layer exposed, respectively, each of their surfaces is coated with a clear-coating layer made of synthetic resin material having transmittancy in order to protect the surface of the ornamental pattern.

14 Claims, 4 Drawing Sheets

SURFACE ORNAMENTAL STRUCTURE OF AN ARTICLE AND A METHOD FOR ORNAMENTALLY WORKING THE SURFACE STRUCTURE OF THE ARTICLE

TECHNICAL FIELD

The present invention relates to an improvement for decoration of an article and more particularly, it concerns a surface decorative structure of an article, able to be easily worked and to form an ornamental pattern of an optional design and a high-grade feeling thanks to the metallic luster as well as, if desired, to form a third-dimensional one and a method of ornamentally working the surface structure of the article.

BACKGROUND ART

As is well known, a design property is sought for the shape of an article itself as regards jewelries such as eye-glass frames, watches and accessories as well as portable telephones, and besides the colors and patterns on the surface of the article and a feel of its material are important elements that constitute a design.

A conventional known example of the ways for decorating the article is subjecting the entire surface of a base material of an article to a metal-plating uniformly (for example, see Patent Literature 1).
Prior Art Literature
Patent Literature
    Patent Literature 1: Registered Utility Model No. 3,112,015 (pages 3 to 4 and FIGS. 1 to 4).

OUTLINE OF THE INVENTION

Problem the Invention Attempts to Solve

However, as for such a surface decoration, it comprises only applying a uniform metallic luster over the base material of the article. Therefore, it does not change the shape of the base material itself of the article but only varies the feel of material of the article's surface.

In consequence, such an ornamental effect is so monotonous that it does not represent the ornamentality more than the feeling of the material and besides lacks the unexpectedness. Further, it was likely to be unable to surpass the beautiful feeling produced by the shape of the base material itself of the article and compensate the high-grade feeling produced with much time and labor taken from the metallic luster, by the covering way because of its monotony to result in being not so attractive as to be disregarded and lost from people's mind.

In view of the above-mentioned dissatisfaction with the conventional way of decorating the article, the present invention has been created and has an object to provide for a surface ornamental structure of an article able to be easily worked and form an ornamental pattern of an optional design and a high-grade feeling offered thanks to the metallic luster and, if desired, to form a third-dimensional one as well as a method for ornamentally working the surface structure of the article.

Means for Solving the Problem

The means the present invention has adopted so as to accomplish the above-mentioned object is explained as follows with reference to the attached drawings.

The present invention has completed a surface ornamental structure of an article by adopting a technical means which comprises:

forming a metal-coated layer 2 by depositing a metal material with at least metallic luster on a surface of a base material 1, and on the other hand providing the metal-coated layer 2 at least partly with a separation part 21, in which the base material 1 has its surface exposed to form an ornamental pattern (P) thanks to a difference between the outer appearance of the base material 1 and the metallic luster of the remaining metal-coated layer 2, and with the base material 1 and the metal-coated layer 2 exposed respectively, each of their surfaces is coated with a clear-coating layer 3 made of synthetic resin material having transmittancy so as to protect the surface of the ornamental pattern (P) attributable to the metallic luster.

The present invention has further adopted a technical means to provide the metal-coating layer 2 with the separation part 21 through emitting laser beam, in addition to the aforesaid means, if necessary, so as to solve the above-mentioned problem.

In order to solve the above-mentioned problem, the present invention has furthermore adopted a technical means to use a plastic material transparent or semi-transparent with transmittancy for the base material 1 and to have the emitted laser beam pass through the base material 1 so that another symmetric separation part 21 is provided on the opposite surface of the base material 1, in addition to the aforesaid means, if necessary, to form the ornamental pattern (P).

In order to solve the above-mentioned problem, the present invention has still further adopted a technical means for attaching a masking agent 22 to at least part of the surface of the metal-coated layer 2 to form a masking part and on the other hand, separating the metal-coated layer 2 at a non-masking part, so as to form the separation part 21 in the metal-coated layer 2, in addition to the aforesaid means, if necessary.

In order to solve the above-mentioned problem, the present invention has still further adopted a technical means to apply the masking agent 22 by pad-printing, silk-screen printing, off-set printing, relief-printing, and cooperate-printing, when providing the metal-coated layer 2 with the separation part 21, in addition to the aforesaid means, if necessary.

In order to solve the above-mentioned problem, the present invention has still further adopted a technical means to form the metal-coated layer 2 by any one of the electric plating, electroless-plating such as chemical plating and substitution plating, vacuum plating such as vacuum evaporation, spattering, ion plating, ion-beam vapor evaporation, physical vapor evaporation (PVD) and chemical evaporation (CVD) or hot dipping, in addition to the aforesaid means, if necessary.

In order to solve the above-mentioned problem, the present invention has still further adopted a technical means to use for the base material 1, any one of plastics, metal, wood, bamboo, tortoiseshell and stone, in addition to the aforesaid means, if necessary.

In order to solve the above-mentioned problem, the present invention has still further adopted a technical means to use for the metal material of the metal-coated layer 2, any one of a metal such as aluminum, titanium, molybdenum, zinc, cobalt, nickel, chrome, gold, silver, copper and iron, an alloy such as copper pyrites (Cu—Fe), stainless steel (Fe—Ni—Cr), bronze (Cu—Sn), silicon oxide, titanium oxide, indium tin oxide (ITO) and diamond like carbon (DLC), titan iodide and titan carbonate, in addition to the aforesaid means, if necessary.

In order to solve the above-mentioned problem, the present invention has still further adopted a technical means to use for the synthetic-resin material of the clear-coating layer 3, colorless and transparent resin like organic resin such as acrylic, polyester, urethane, polyolefin, fluorine, epoxy, vinyl-acetate and chloroprene resin; and organic resin mixed with inorganic polymer, ultraviolet-ray setting resin, electronic-beam setting resin, in addition to the aforesaid means, if necessary.

EFFECT OF THE INVENTION

The present invention forms a metal-coated layer which comprises a metal material with at least metallic luster, deposited on a surface of a base material, and on the other hand, provides the metal-coated layer at least partly with a separation part, in which the base material has its surface exposed, so as to form an ornamental pattern by a difference between the outer appearance of the base material and the metallic luster of the remaining metal-coated layer, and with the base material and the metal-coated layer exposed, respectively, each of their surfaces is coated with a clear-coating layer made of a synthetic-resin material having transmittancy so as to protect the surface of the ornamental pattern produced by the metallic luster. Thus it is possible to form an ornamental pattern of an optional design and a high-grade feeling thanks to the metallic luster by a simple working process.

In addition, if necessary, it is possible to provide another symmetric separation part on the opposite surface of the base material by using a transparent or semi-transparent plastic material of transmittancy for the base material and passing the emitted laser beam through the base material, so as to form a third dimensional ornamental pattern. Therefore, it can be said that the present invention is extremely highly worthy of being practically available in surface working of the jewelries.

MOST PREFERRED EMBODIMENT OF THE INVENTION

The further detailed explanation is given below based on the drawings concretely showing the most preferred embodiments of the present invention.

First Embodiment

Figure 1:
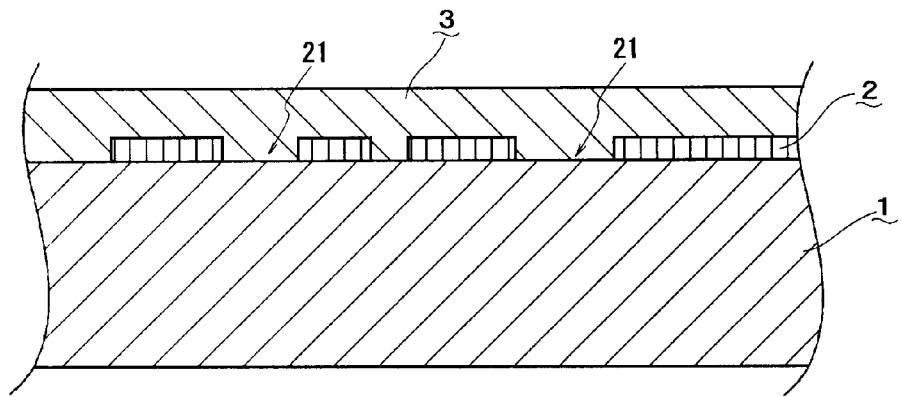
[FIG. 1] is an explanatory sectional view showing a surface ornamental structure according to a first embodiment of the present invention.

The first embodiment of the present invention is explained with reference to FIGS. 1 to 4. In FIG. 1, reference numeral 1 designates a base material and reference numeral 2 indicates a metal-coated layer. This metal-coated layer 2 comprises a metal material having at least metallic luster deposited on a surface of the base material 1.

Still more, reference numeral 3 indicates a clear-coating layer. This clear-coating layer 3 is made of synthetic resin material with transmittancy.

Figure 2:
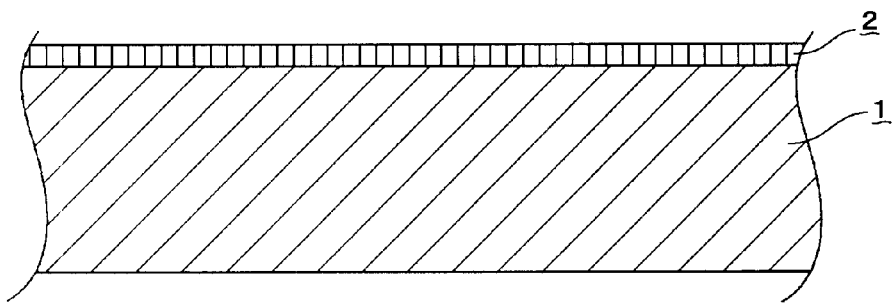
[FIG. 2] is an explanatory sectional view showing another surface ornamental structure according to the first embodiment of the present invention.

Then in order to construct an ornamental structure according to the present invention, first, the metal-coated layer 2 is formed by depositing a metal material with at least metallic luster on the surface of the base material 1 (see FIG. 2). Adoptable for the concrete materials of the base material 1 are synthetic resin (polyethylene terephtalate, epoxy, polycarbonate, acetyl cellulose (acetate), nylon, ABS resin, polyacetal, polyimide, fluorine resin or the like), metal (nickel-copper-zinc alloy, copper alloy, nickel alloy, titanium alloy, stainless steel, aluminum alloy, ultra-resilient alloy or the like), wood, bamboo, tortoiseshell, stone or the like). In the present embodiment, synthetic resin (acetyl cellulose) is adopted.

Further, the object that is to be coated for decoration by the base material 1 is selected from a group which consists of a pair of glasses, lighter, watch, ear ring, bracelet, necklace, ring, writing tool, portable phone or the like. A temple of the paired glasses is adopted in the present embodiment.

Then in order to form the metal-coated layer 2, any one of the electric plating; electroless-plating such as chemical plating and substitution plating; vacuum plating such as vacuum evaporation, sputtering, ion plating, ion-beam vapor evaporation, physical vapor evaporation (PVD) and chemical evaporation (CVD) or hot dipping can be adopted. In the present embodiment, when the ion plating of sputtering-system excellent in fixation is used, the layer can be assuredly and strongly fixed.

Concretely, the base material 1 is placed within an ion-plating device and has its surface subjected to the bombard-cleaning in the atmosphere of argon. At this time, from the view-point of the fixation, for the pre-treatment, the surface of the base material 1 is preferably subjected to the etching treatment. Next, titanium-plated coating is formed as the metal-coated layer 2 by the ion-plating of sputtering system.

It is to be noted that aluminum, titanium, molybdenum, zinc, cobalt, nickel, chrome, gold, silver, copper and iron, an alloy such as copper pyrites (Cu—Fe), stainless steel (Fe—Ni—Cr), bronze (Cu—Sn), silicon oxide, titanium oxide, indium tin oxide (ITO), diamond like carbon (DLC), titan iodide and titan carbonate can be used. Silver and aluminum of high reflection-efficiency are preferably used.

Moreover, among the above-mentioned metal materials, as regards the alloy materials, there being difference between alloy components in the speed of sublimation, the vacuum evaporation and ion plating are not appropriate. Accordingly, ultra-high vacuum sputtering method is adopted. Further, as to the oxides and iodides, they can be generated by the atmospheric gas within the chamber.

Next, the metal-coated layer 2 is at least partly provided with a separation part 21, in which the base material 1 has its surface exposed, and the ornamental pattern (P) is formed thanks to a difference between the outer appearance of the base material 1 and the metallic luster of the remaining metal-coated layer 2.

Figure 3:
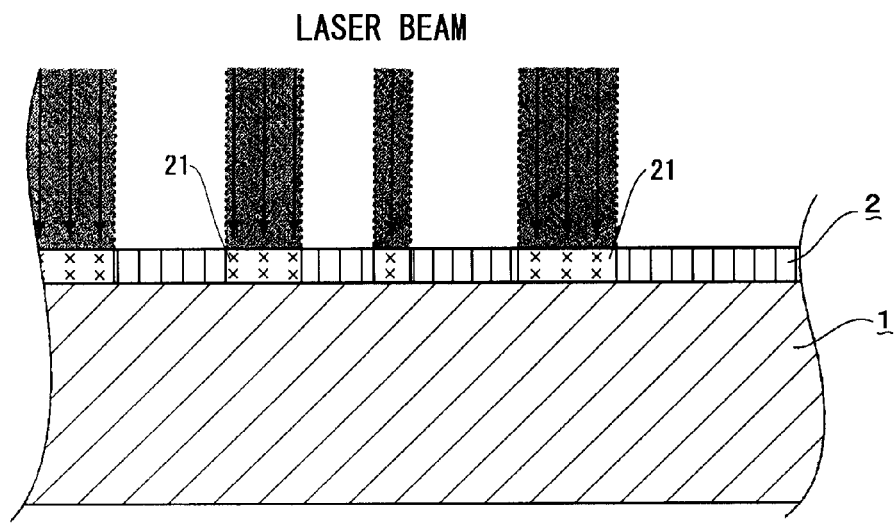
[FIG. 3] is an explanatory sectional view showing still another surface ornamental structure according to the first embodiment of the present invention.

In the present embodiment, the separation part 21 is provided in the metal-coated layer 2 by emitting laser beam (YAG) to a part to be separated for the purpose of removing the portions marked by (x) in the drawing (see FIG. 3). At this time, as regards a position for emitting the laser beam, the computer numerical-control (NC control) program can be used so as to decide it or the position may be linked with the data of the ornamental pattern (P) designed on the computer.

Thereafter, with the base material 1 and the metal-coated layer 2 exposed, respectively, each of their surfaces is coated with a clear-coating layer 3 made of synthetic resin material of transmittancy so as to protect the surface of the ornamental pattern (P) produced by the metallic luster (see FIG. 1).

The clear-coating layer 3 according to the present embodiment comprises a transparent or semi-transparent clear synthetic resin material (preferably, thermosetting resin). Here, the term "transparent" or "semi-transparent" means that total transmittancy is at least 40%, preferably at least 50%.

Further, usable for the clear synthetic resin material are, for example, organic resin of high transparency such as acrylic, polyester, urethane, polyolefin, fluorine, epoxy or vinyl-acetate, chloroprene resin, alternatively colorless and transparent resin such as resin able to form such creped pattern, organic resin mixed with inorganic polymer, ultraviolet-ray setting resin and electronic-beam setting resin. As far as the transparency is not damaged, anti-corrosion pigment, coloring pigment and dye may be added, if necessary.

And as to the method for applying the synthetic resin paint to the clear-coating layer 3, an ordinary method such as the spraying method, the transcribing method and the dipping method can be used. The layer preferably has a thickness of 10 to 50 μm.

Figure 4:
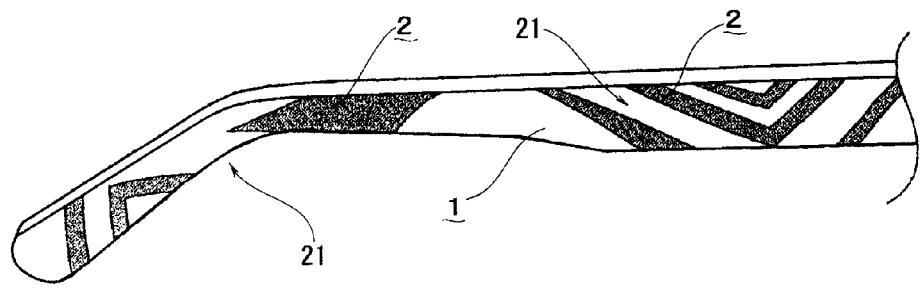
[FIG. 4] is a perspective view showing parts of glasses using the surface ornamental structure according to the first embodiment of the present invention.

The thus formed ornamental structure of the present embodiment can simply form an ornamental pattern of an optional design and a high-grade feeling thanks to the metallic luster by a difference between the outer appearance of the surface of the base material 1 and the metallic luster of the remaining metal-coated layer 2 (see FIG. 4).

Second Embodiment

Figure 5:
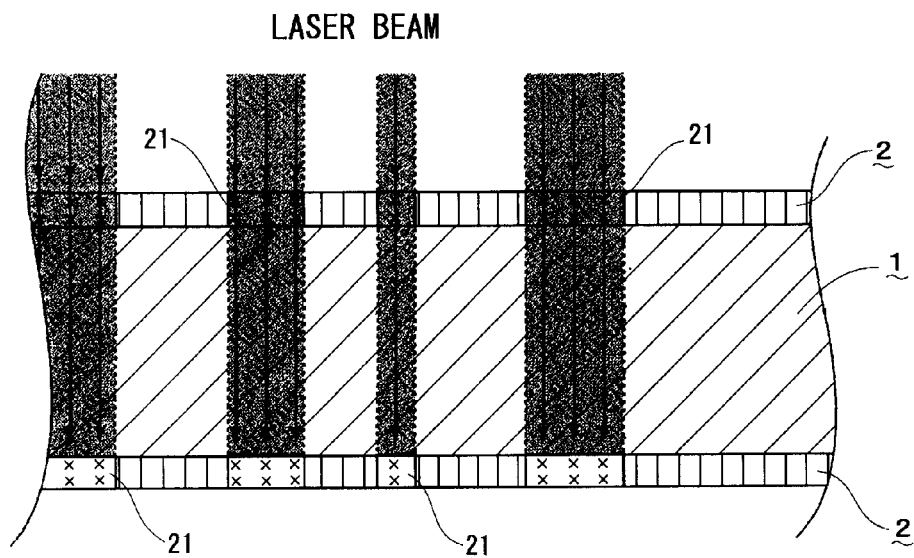
[FIG. 5] is an explanatory sectional view showing a surface ornamental structure according to a second embodiment of the present invention.
Figure 6:
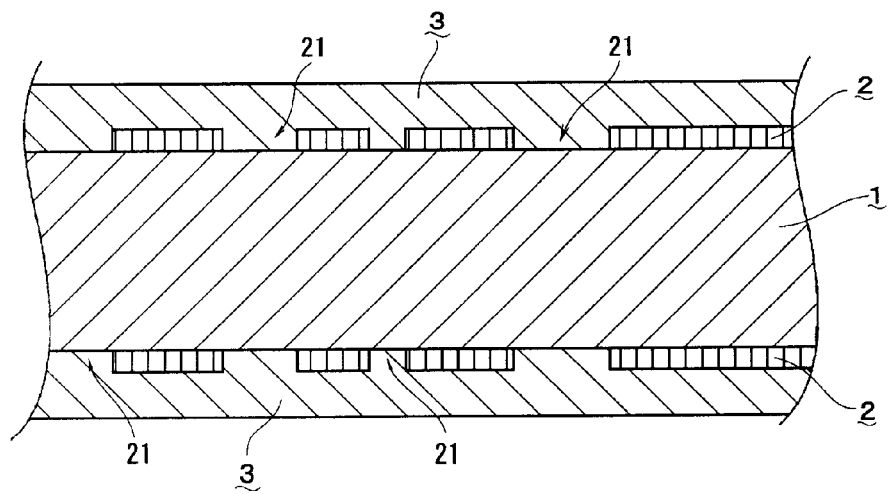
[FIG. 6] is an explanatory sectional view showing another surface ornamental structure according to the second embodiment of the present invention.
Figure 7:
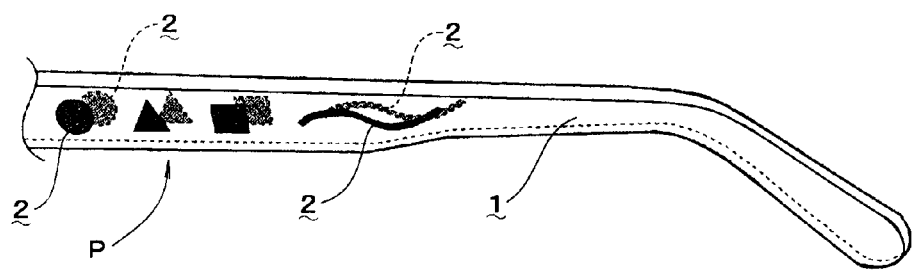
[FIG. 7] is a perspective view showing parts of glasses using the surface ornamental structure according to the second embodiment of the present invention.

Next, a second embodiment of the present invention is explained below with reference to FIGS. 5 to 7. This embodiment has been made by developing the first embodiment. First, the base material 1 is made of a transparent or semi-transparent material of transmittancy and has the laser beam emit to its surface and then pass through the base material 1 (see FIG. 5).

By doing so, the laser beam that has passed through the base material 1 is enabled to form another symmetric separation part 21 on the opposite surface of the base material 1 as well so that it can form the ornamental pattern (P).

Subsequently, as done in the first embodiment, the clear-coating layer 3 is provided on the opposite surfaces, thereby completing the ornamental structure. According to the present embodiment, it is possible to form a third dimensional ornamental pattern by an easy working (see FIGS. 6 and 7).

Third Embodiment

Thirdly, a third embodiment of the present invention is explained below with reference to FIGS. 8 to 10. According to this embodiment, the separation part 21 of the metal-coated layer 2 is formed as follows.

Figure 8:
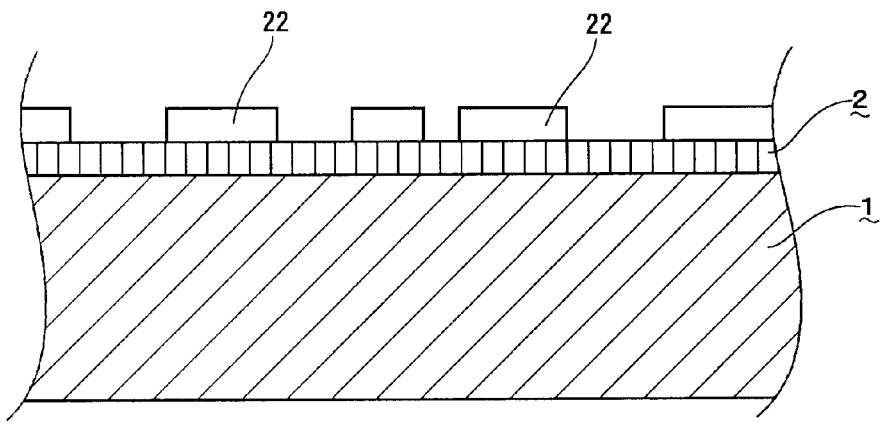
[FIG. 8] is an explanatory sectional view showing a surface ornamental structure according to a third embodiment of the present invention.

First, the metal-coated layer 2 has a surface to at least part of which a masking agent 22 is attached so as to form a masking part (see FIG. 8).

Concretely, when providing the metal-coated layer 2 with the separation part 21, the masking agent 22 is applicable by the pad-printing, silk-screen printing, off-set printing, relief-printing, and cooperate-printing. In the present embodiment, the pad-printing, good in workability, is adopted.

At this time, when an applying agent is used as the masking agent, not only a resin or rubber one may be applied, but also a means for coating by attaching a tape or a film may be adopted.

Figure 9:
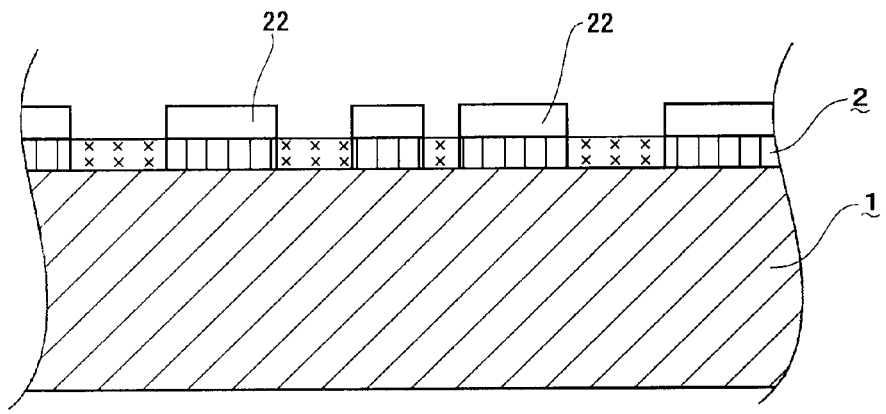
[FIG. 9] is an explanatory sectional view showing another surface ornamental structure according to the third embodiment of the present invention.

Then the metal-coated layer 2 at the non-masked part (the portions marked by (x) in FIG. 9) is separated. At this time, the separation can be made by utilizing a separation agent. Available for the separation agent are cyan (soda cyanides), ammonium, chelating agent, oxidation agent, potassium hydrogen, sulfuric, hydrogen peroxide, fluorine-hydrogen peroxide, nitric ones.

Figure 10:
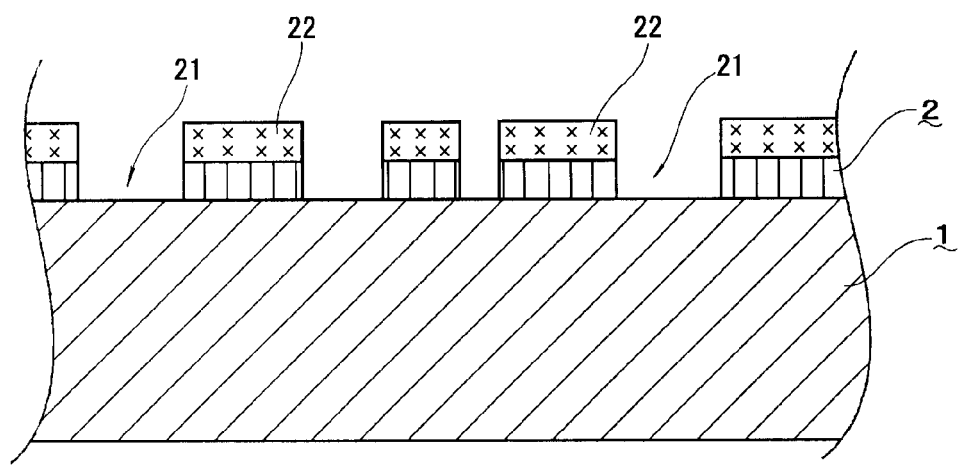
[FIG. 10] is an explanatory sectional view showing still another surface ornamental structure according to the third embodiment of the present invention.

After the non-masking part of the metal-coated layer 2 has been separated as such, additionally, the applied masking agent 22 (the portions marked by (x) in FIG. 10) is removed by using trichloroethylene, toluene or the like organic solvent, and soda carbonate, soda hydrogen or the like liquid agent.

Subsequently, as done in the other embodiments, the clear-coating layer 3 is provided on the surface to complete the ornamental structure (see FIG. 1).

The present invention is substantially constituted as above, but is not limited to those illustrated. Various changes can be made as far as they don't depart from the description within the scope of claims. The materials used for the base material 1 and those for the metal-coated layer 2 can be suitably combined in view of the design and the compatibility of the article.

| Explanation of Numerals | |
| --- | --- |
| 1 | base material |
| 2 | metal-coated layer |
| 21 | separation part |
| 22 | masking agent |
| 3 | clear-coating layer |
| P | ornamental pattern |

I claim:

1. A surface ornamental structure of an article, comprising a metal layer with metallic luster on both faces of a base material made of a transparent or semi-transparent plastic material having transmittancy, the metal layer being at least partly provided with separation parts on both faces of the base material formed symmetrically by emitting laser beam through the base material, in which the base material has its surface exposed so as to form an ornamental pattern comprising outer surfaces of the base material and the metal layer, wherein with the base material and the metal layer exposed, respectively, each of their surfaces is coated with a clear-coating layer which comprises a synthetic-resin material having transmittancy so as to protect the surface of the ornamental pattern.

2. The surface ornamental structure of an article as set forth in claim 1, wherein, the metal layer is formed by any one of the electric plating; electroless-plating such as chemical plating or substitution plating; vacuum plating such as vacuum evaporation, sputtering, ion plating, ion-beam vapor evaporation, physical vapor evaporation (PVD) or chemical evaporation (CVD); and hot dipping.

3. The surface ornamental structure of an article as set forth in claim 2, wherein,
the metal layer comprises any one of a metal such as aluminum, titanium, molybdenum, zinc, cobalt, nickel, chrome, gold, silver, copper and iron; an alloy such as copper pyrites (Cu—Fe), stainless steel (Fe—Ni—Cr) and bronze (Cu—Sn); and silicon oxide, titanium oxide, indium tin oxide (ITO) and diamond-like-carbon (DLC), titan iodide and titan carbonate.

4. The surface ornamental structure of an article as set forth in claim 3, wherein,
the synthetic-resin material of the clear-coating layer comprises colorless and transparent organic resin such as acrylic, polyester, urethane, polyolefin, fluorine, epoxy, vinyl-acetate, chloroprene; and said organic resin mixed with inorganic polymer, ultraviolet-ray setting resin and electronic-beam setting resin.

5. The surface ornamental structure of an article as set forth in claim 2, wherein,
the synthetic-resin material of the clear-coating layer comprises colorless and transparent organic resin such as acrylic, polyester, urethane, polyolefin, fluorine, epoxy, vinyl-acetate, chloroprene; and said organic resin mixed with inorganic polymer, ultraviolet-ray setting resin and electronic-beam setting resin.

6. The surface ornamental structure of an article as set forth in claim 1, wherein,
the metal layer comprises any one of a metal such as aluminum, titanium, molybdenum, zinc, cobalt, nickel, chrome, gold, silver, copper and iron; an alloy such as copper pyrites (Cu—Fe), stainless steel (Fe—Ni—Cr) and bronze (Cu—Sn); and silicon oxide, titanium oxide, indium tin oxide (ITO) and diamond-like-carbon (DLC), titan iodide and titan carbonate.

7. The surface ornamental structure of an article as set forth in claim 6, wherein,
the synthetic-resin material of the clear-coating layer comprises colorless and transparent organic resin such as acrylic, polyester, urethane, polyolefin, fluorine, epoxy, vinyl-acetate, chloroprene; and said organic resin mixed with inorganic polymer, ultraviolet-ray setting resin and electronic-beam setting resin.

8. The surface ornamental structure of an article as set forth in claim 1, wherein,
the synthetic-resin material of the clear-coating layer comprises colorless and transparent organic resin such as acrylic, polyester, urethane, polyolefin, fluorine, epoxy, vinyl-acetate, chloroprene; and said organic resin mixed with inorganic polymer, ultraviolet-ray setting resin and electronic-beam setting resin.

9. A method for making the surface ornamental structure of an article of claim 1, which comprises:
providing a base material made of a transparent or semi-transparent plastic material;
depositing a metal layer with metallic luster, on both faces of the base material,
allowing an emitted laser beam to pass through the base material so that symmetric separation parts are formed in the metal layer on both faces of the base material, the separation parts provided at least partly in the metal layer to have portions of the surface of the base material exposed so as to represent an ornamental pattern comprising outer surfaces of the base material and the remaining metal layer, and
with the base material and the metal layer exposed respectively, coating each of their surfaces with a synthetic resin material having transmittancy so as to form a clear-coating layer, which protects the surface of the ornamental pattern.

10. The method as set forth in claim 9, which includes
attaching a masking agent to at least part of the surface of the metal layer so as to form a masking part; and
removing portions of the metal layer that are not covered by the masking part to form the separation part in the metal layer.

11. The method as set forth in claim 10, which includes
applying the masking agent by pad-printing, silk-screen printing, off-set printing, relief-printing, or cooperate-printing, so as to provide the metal layer with the separation part.

12. The method as set forth in claim 9, which includes
forming the metal layer by any one of the electric plating; electroless-plating such as chemical plating or substitution plating; vacuum plating such as vacuum evaporation, sputtering, ion plating, ion-beam vapor evaporation, physical vapor evaporation (PVD) or chemical evaporation (CVD); and hot dipping.

13. The method as set forth in claim 9, wherein
the metal layer comprises any one of a metal such as aluminum, titanium, molybdenum, zinc, cobalt, nickel, chrome, gold, silver, copper and iron; an alloy such as copper pyrites (Cu—Fe), stainless steel (Fe—Ni—Cr) and bronze (Cu—Sn); and silicon oxide, titanium oxide, indium tin oxide (ITO), diamond like carbon (DLC), titan iodide and titan carbonate.

14. The method as set forth in claim 9, wherein
the synthetic-resin material which forms the clear-coating layer comprise colorless and transparent organic resin such as acrylic, polyester, urethane, polyolefin, fluorine, epoxy, vinyl-acetate and chloroprene resin; and said organic resin mixed with inorganic polymer, ultraviolet setting resin and electronic-beam setting resin.

* * * * *